United States Patent
Hsu et al.

(10) Patent No.: US 11,211,903 B1
(45) Date of Patent: Dec. 28, 2021

(54) OVER CHARGE PROTECTION METHOD AND VOLTAGE CONVERTER USING THE OVER CHARGE PROTECTION METHOD

(71) Applicant: Elite Semiconductor Microelectronics Technology Inc., Hsinchu (TW)

(72) Inventors: Ya-Mien Hsu, Hsinchu (TW); Deng-Yao Shih, Hsinchu (TW); Yang-Jing Huang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/087,643

(22) Filed: Nov. 3, 2020

(51) Int. Cl.
*H03F 3/217* (2006.01)
*H03F 1/52* (2006.01)
*H03F 3/38* (2006.01)

(52) U.S. Cl.
CPC ............... *H03F 1/52* (2013.01); *H03F 3/217* (2013.01)

(58) Field of Classification Search
CPC ............... H03F 1/52; H03F 3/217; H03F 3/38

USPC ..................... 330/10, 207 A, 251, 298, 207 P
See application file for complete search history.

(56) References Cited

U.S. PATENT DOCUMENTS 6,472,933 B2 * 10/2002 Hsu ..................... H03F 3/2173
330/10
9,654,068 B2 * 5/2017 Wu ..................... H03F 3/45475

\* cited by examiner

*Primary Examiner* — Hieu P Nguyen
(74) *Attorney, Agent, or Firm* — Winston Hsu

(57) ABSTRACT

An over charge protection method applied to a voltage converter which can operate in a quaternary modulation mode (Q mode) or a ternary modulation mode (T mode). The over charge protection method comprises: (a) determining whether the voltage converter operates in the Q mode or the T mode; and (b) setting a current threshold of the voltage converter to a first over current threshold if the voltage converter operates in the T mode; and (c) setting the current threshold to a second over current threshold if the voltage converter operates in the Q mode, wherein the first current threshold is smaller than the second over current threshold.

18 Claims, 7 Drawing Sheets

OVER CHARGE PROTECTION METHOD AND VOLTAGE CONVERTER USING THE OVER CHARGE PROTECTION METHOD

BACKGROUND OF THE INVENTION

1. Field of the Invention

The present invention relates to an over charge protection method and a voltage converter, and particularly relates to an over charge protection method and a voltage converter which can adjust the settings of the over charge protection mechanism corresponding to the mode which the voltage converter operates in.

2. Description of the Prior Art

A conventional Class-D amplifier may have an over current issue. The over current may be caused by various factors. For example, the over current may be caused by overloading the Class-D amplifier or circuit short. Therefore, the Class-D amplifier may have an over current protection (herein after, OCP) mechanism to limit the current thereof, to improve the over current issue.

The class-D amplifier may operate in different modes, and the OCP mechanism has different proper settings corresponding to different modes. However, the conventional class-D amplifier could not automatically change the settings responding to different modes.

SUMMARY OF THE INVENTION

Therefore, one objective of the present invention is to provide an OCP method which can automatically change settings of the OCP mechanism responding to different modes.

Another objective of the present invention is to provide a voltage converter which can automatically change settings of the OCP mechanism responding to different modes.

One embodiment of the present invention discloses an over charge protection method applied to a voltage converter which can operate in a quaternary modulation mode (Q mode) or a ternary modulation mode (T mode). The over charge protection method comprises: (a) determining whether the voltage converter operates in the Q mode or the T mode; and (b) setting a current threshold of the voltage converter to a first over current threshold if the voltage converter operates in the T mode; and (c) setting the current threshold to a second over current threshold if the voltage converter operates in the Q mode, wherein the first current threshold is smaller than the second over current threshold.

Another embodiment of the present invention discloses: a voltage converter, which can operate in a quaternary modulation mode (Q mode) or a ternary modulation mode (T mode), comprising: an error amplifier, configured to receive input signals; a PWM circuit, configured to generate initial PWM signals according to outputs of the error amplifier; at least one Q/T logic circuit, configured to use quaternary modulation or ternary modulation mode modulation to generate at least one mode PWM signal; an output circuit configured to generate an output signal according to a mode PWM signal; a mode detection circuit, configured to detect whether the voltage converter operates in the Q mode or the T mode; an over charge protection (OCP) circuit, configured to limit a current of the voltage converter to be lower than a current threshold. The current threshold is set to a first over current threshold if the voltage converter operates in the T mode. The current threshold is set to a second over current threshold larger than the first over current threshold if the voltage converter operates in the Q mode.

In view of above-mentioned embodiments, the mode of the voltage converter can be automatically detected, and settings of the OCP mechanism can be automatically changed corresponding to the mode which the voltage converter operates in. Therefore, the issue that the voltage converter could not automatically change settings of the OCP mechanism can be improved.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Also, the term "first", "second", "third" in following descriptions are only for the purpose of distinguishing different one elements, and do not mean the sequence of the elements. For example, a first device and a second device only mean these devices can have the same structure but are different devices.

Figure 1:
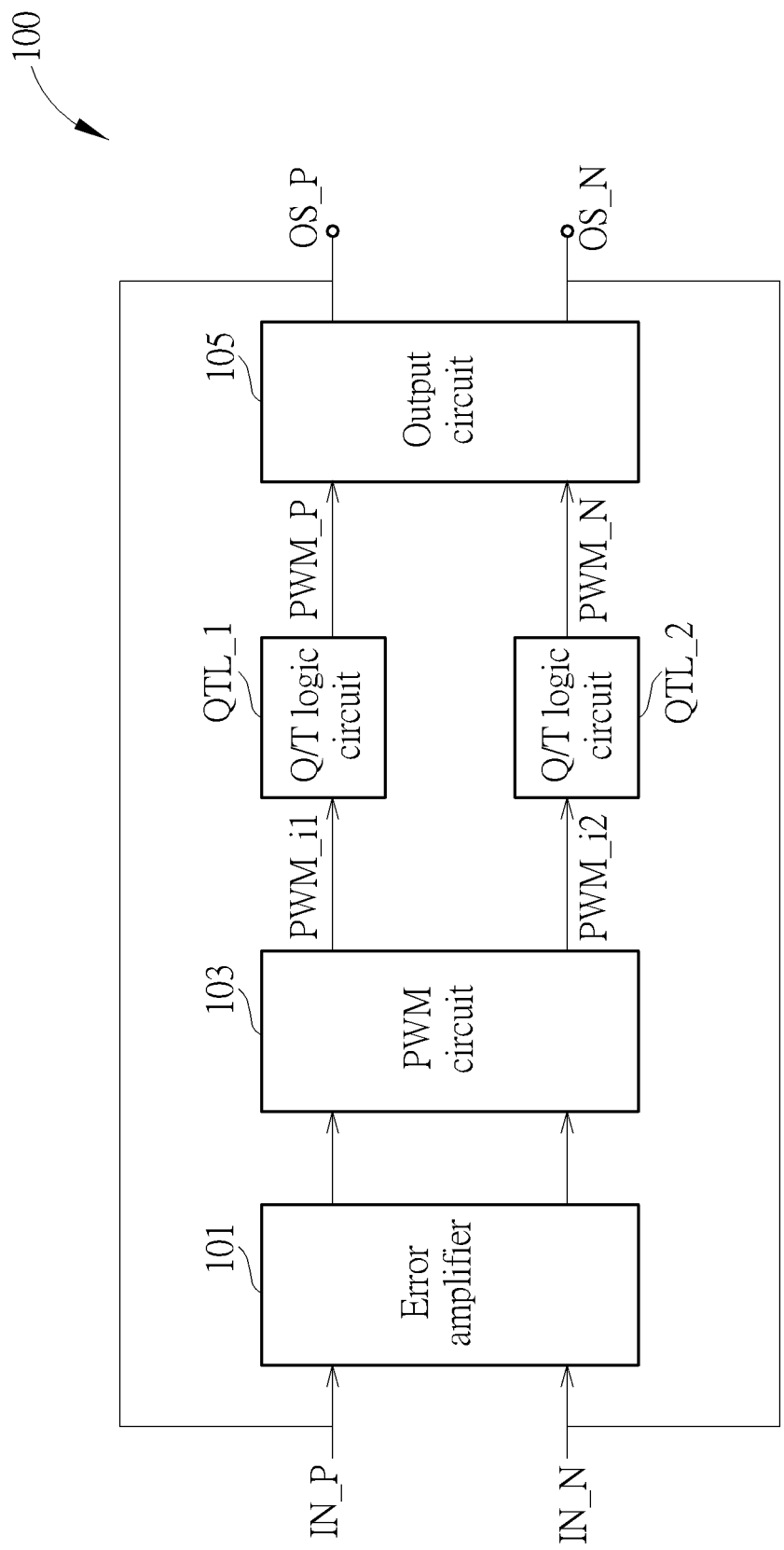
FIG. 1 is a block diagram illustrating a voltage converter according to one embodiment of the present invention.

FIG. 1 is a block diagram illustrating a voltage converter 100 according to one embodiment of the present invention. Please note, in following embodiments, a differential input/output voltage converter is used as an example for explaining. However, the voltage converter of the present invention can be implemented by a single input/output voltage converter. In one embodiment, the voltage converter 100 is a Class-D amplifier, but not limited.

As shown in FIG. 1, the voltage converter 100 comprises an error amplifier 101, a PWM circuit 103, Q/T logic circuits QTL_1, QTL_2, and an output circuit 105. The error amplifier 101 is configured to receive input signals IN_P, IN_N. The PWM circuit 103 is configured to generate initial PWM signals PWM_i1, PWM_i2 according to outputs of the error amplifier 101. The Q/T logic circuits QTL_1, QTL_2 are respectively configured to generate mode PWM signals PWM_P and PWM_N. In a quaternary modulation mode (Q mode herein after), the Q/T logic circuits QTL_1, QTL_2 respectively use quaternary modulation to generate the mode PWM signals PWM_P and PWM_N. The voltage converter 100 has four operating states in the Q mode. Details of the Q mode and the quaternary modulation are stated in well-known documents such as the US patent with a patent number U.S. Pat. No. 6,262,632, thus are omitted for brevity here.

In a ternary modulation mode (T mode herein after), the Q/T logic circuit QTL_1 and/or the Q/T logic circuit QTL_2 respectively use ternary modulation to generate the mode PWM signal PWM_P and/or the mode PWM signal PWM_N. The voltage converter 100 has three operating states in the T mode. Details of the T mode and the ternary modulation are stated in well-known documents such as the US patent with a patent number U.S. Pat. No. 6,614,297, thus are omitted for brevity here.

Pulse widths of the mode PWM signals in the T mode are smaller than pulse widths of the mode PWM signals in the Q mode. Therefore, the pulse widths of the mode PWM signals in the T mode may be less than the detection time of OCP, and malfunction may be caused accordingly. Thus, in the present invention, the settings of the OCP mechanism are changed corresponding to the mode which the voltage converter 100 operates in. Additionally, the output circuit 105 is configured to generate output signals OS_P, OS_N according to the mode PWM signals PWM_P, PWM_N.

Figure 2:
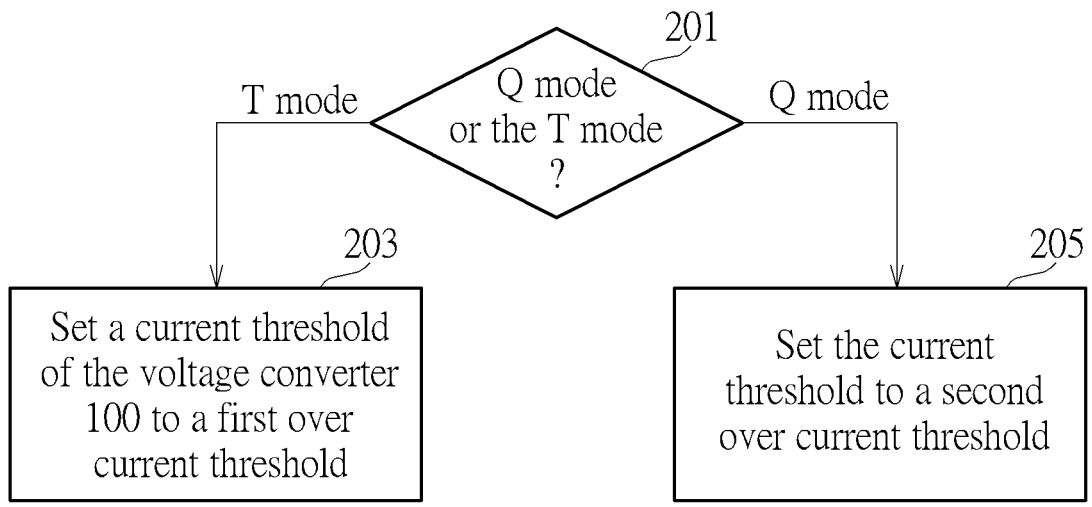
FIG. 2 is a flow chart illustrating an over charge protection method according to one embodiment of the present invention.

One embodiment of the present invention discloses an over charge protection method, which can be used by the voltage converter 100 illustrated in FIG. 1 and comprises following steps illustrated in FIG. 2:

Step 201

Determine whether the voltage converter 100 operates in the Q mode or the T mode.

Step 203

Set a current threshold of the voltage converter 100 to a first over current threshold if the voltage converter operates in the T mode.

Step 205

Set the current threshold to a second over current threshold if the voltage converter operates in the Q mode. The first current threshold is smaller than the second over current threshold, since the voltage converter 100 has smaller currents in the T mode. In one embodiment, the first over current threshold is half of the second over current threshold.

The first over current threshold and the second over current threshold are maximum current of the voltage converter 100. Therefore, in the T mode, the OCP mechanism limits the current of the voltage converter 100 to be lower than or equals to the first over current threshold. Also, in the Q mode, the OCP mechanism limits the current of the voltage converter 100 to be lower than or equals to the second over current threshold. The OCP mechanism can be performed by an OCP circuit 108 shown in FIG. 4, which can be implemented by various circuits. For example, the OCP circuit 108 can be a processor which can execute at least one program to perform the OCP mechanism. For another example, the OCP circuit 108 can be a logic circuit comprising a plurality of logic gates which can control the current of the voltage converter 100 according to output signal of the voltage converter 100. Persons skilled in the art can understand how to implement the OCP circuit 108 based on disclosure of the present invention, thus descriptions thereof are omitted for brevity here.

In one embodiment, the step 201 determines whether the voltage converter 100 operates in the Q mode or the T mode according to pulse widths of the mode PWM signals PWM_P or PWM_N. Also, in one embodiment, the step 201 detects the pulse widths at a zero crossing point of input signals IN_P, IN_N of the voltage converter 100. Such steps can be performed by the circuits illustrated in FIG. 3, which is a block diagram illustrating a voltage converter according to another embodiment of the present invention.

Figure 3:
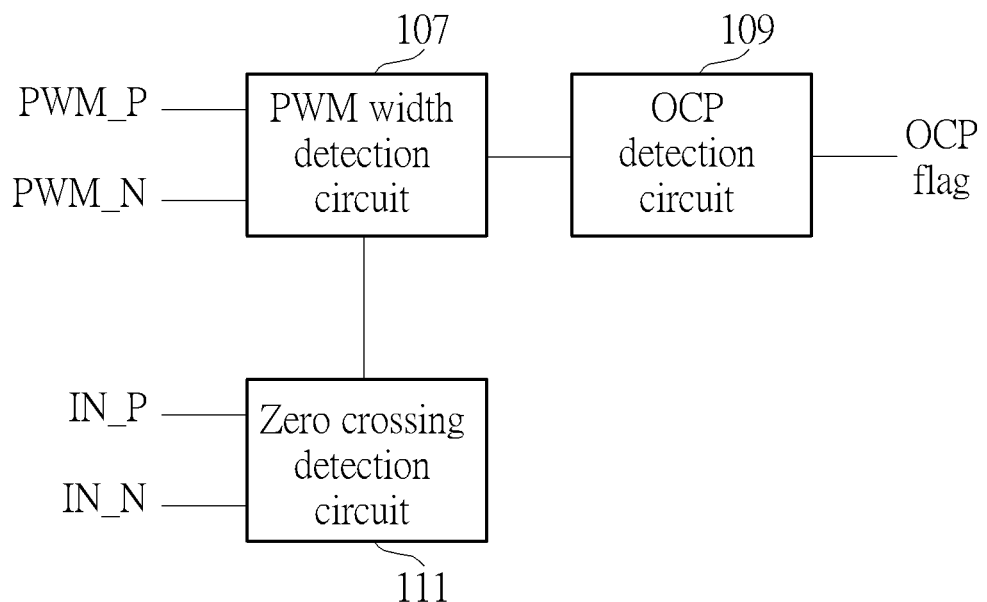
FIG. 3 is a block diagram illustrating a voltage converter according to another embodiment of the present invention.

As shown in FIG. 3, besides the circuits illustrated in FIG. 1, the voltage converter 100 further comprises a PWM width detection circuit 107, an OCP detection circuit 109, and a zero crossing detection circuit 111. The PWM width detection circuit 107 is configured to detect pulse widths of mode PWM signals PWM_P, PWM_N, thus can be regarded as a mode detection circuit. Also, the OCP detection circuit 109 generates an OCP flag to adjust the settings of the OCP mechanism, according to the detected pulse widths (i.e., according to which one of the T mode and the Q mode does the voltage converter operates in). Additionally, the zero crossing detection circuit 111 receives input signals IN_P, IN_N, and is configured to detect the zero crossing points of the input signals IN_P, IN_N. The PWM width detection circuit 107, the OCP detection circuit 109, and the zero crossing detection circuit 111 can be implemented by logic circuits comprising a plurality of logic gates. Persons skilled in the art can understand how to implement the PWM width detection circuit 107, the OCP detection circuit 109, and the zero crossing detection circuit 111 based on disclosure of the present invention, thus descriptions thereof are omitted for brevity here.

Figure 4:
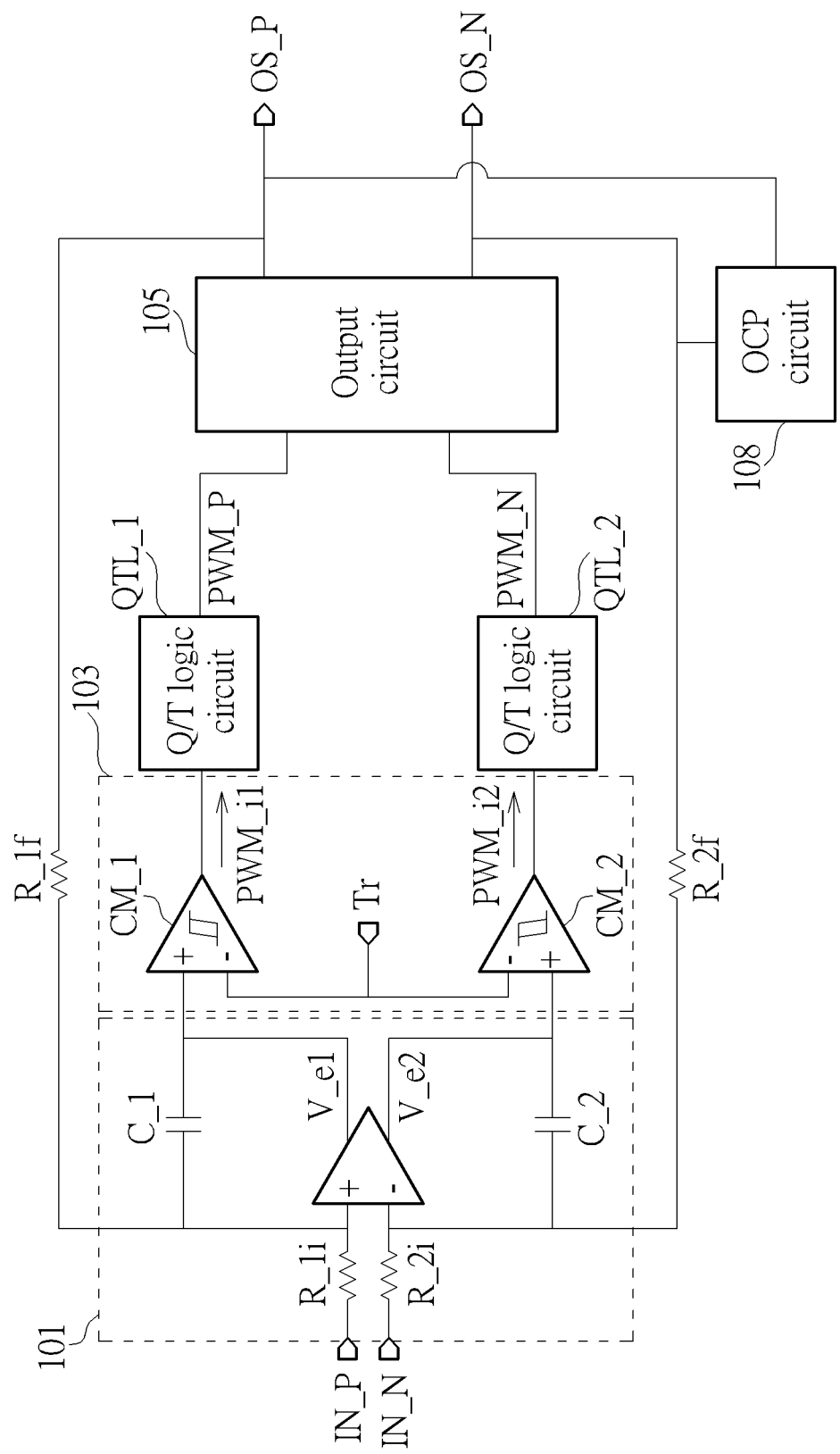
FIG. 4 is a circuit diagram illustrating a detail structure of the embodiment illustrated in FIG. 1, according to one embodiment of the present invention.

FIG. 4 is a circuit diagram illustrating a detail structure of the embodiment illustrated in FIG. 1, according to one embodiment of the present invention. Please note, the circuit in FIG. 4 is only an example for explaining but does not mean to limit the scope of the present invention. As illustrated in FIG. 4, the error amplifier 101 comprises resistors $R\_1i$, $R\_2i$, capacitors $C\_1$, $C\_2$. Also, the PWM circuit 103 comprises hysteretic comparators $CM\_1$, $CM\_2$, to generate initial PWM signals PWM_i1, PWM_i2 according to output of the error amplifier 101 and a triangular wave signal Tr. The output circuit 105 is configured to generate output signals OS_P and OS_N according to the mode PWM signal PWM_P, PWM_N. The output circuit 105 can have different structures corresponding to different required circuit designs. For example, the output circuit 105 can have switches and capacitors. The switches charge or discharge the capacitors to generate output signals OS_P and OS_N.

Figure 5:
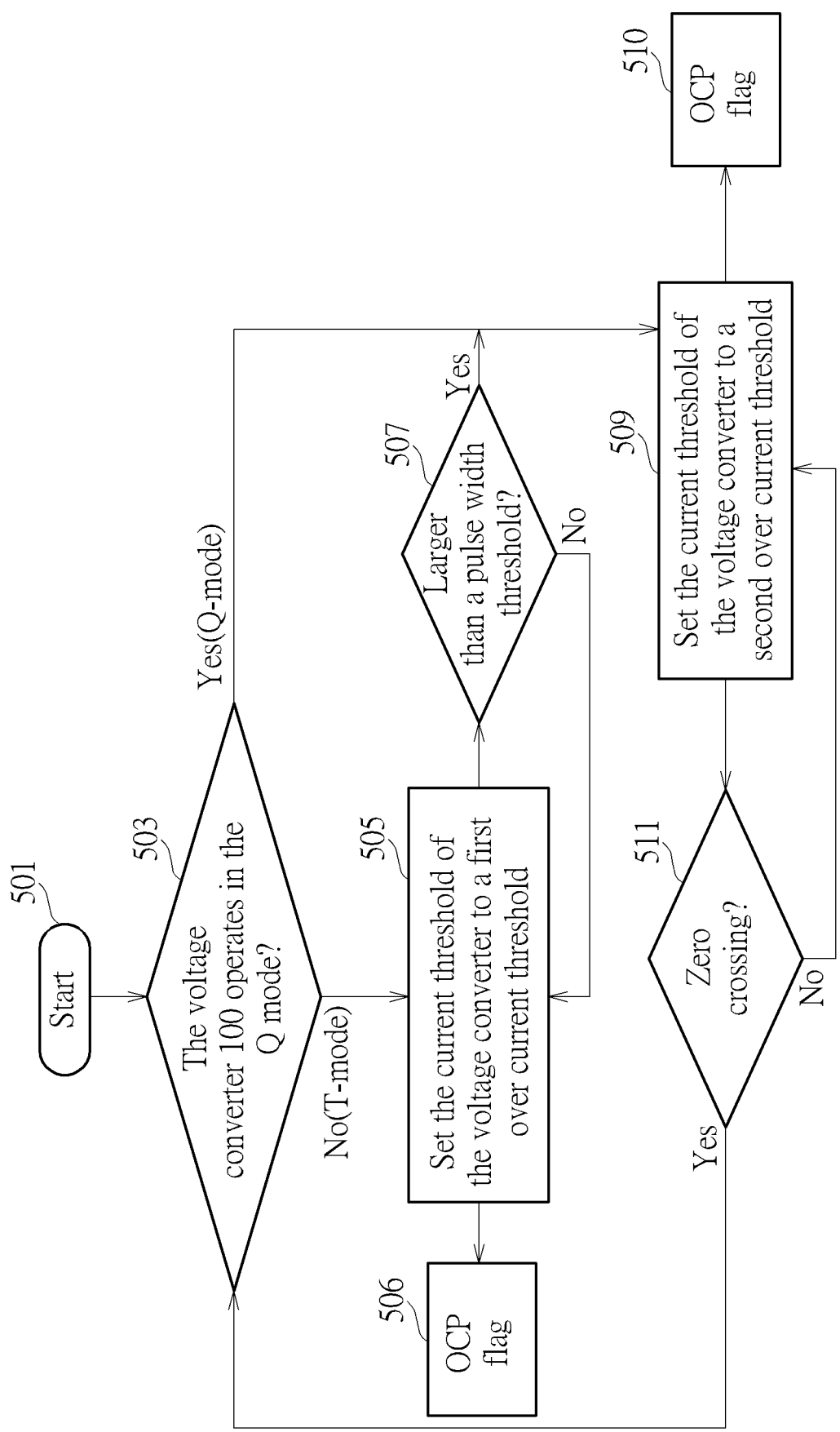
FIG. 5 and FIG. 6 are flow charts illustrating operations of the voltage converter illustrated in FIG. 1 and FIG. 3, according to different embodiments of the present invention.
Figure 6:
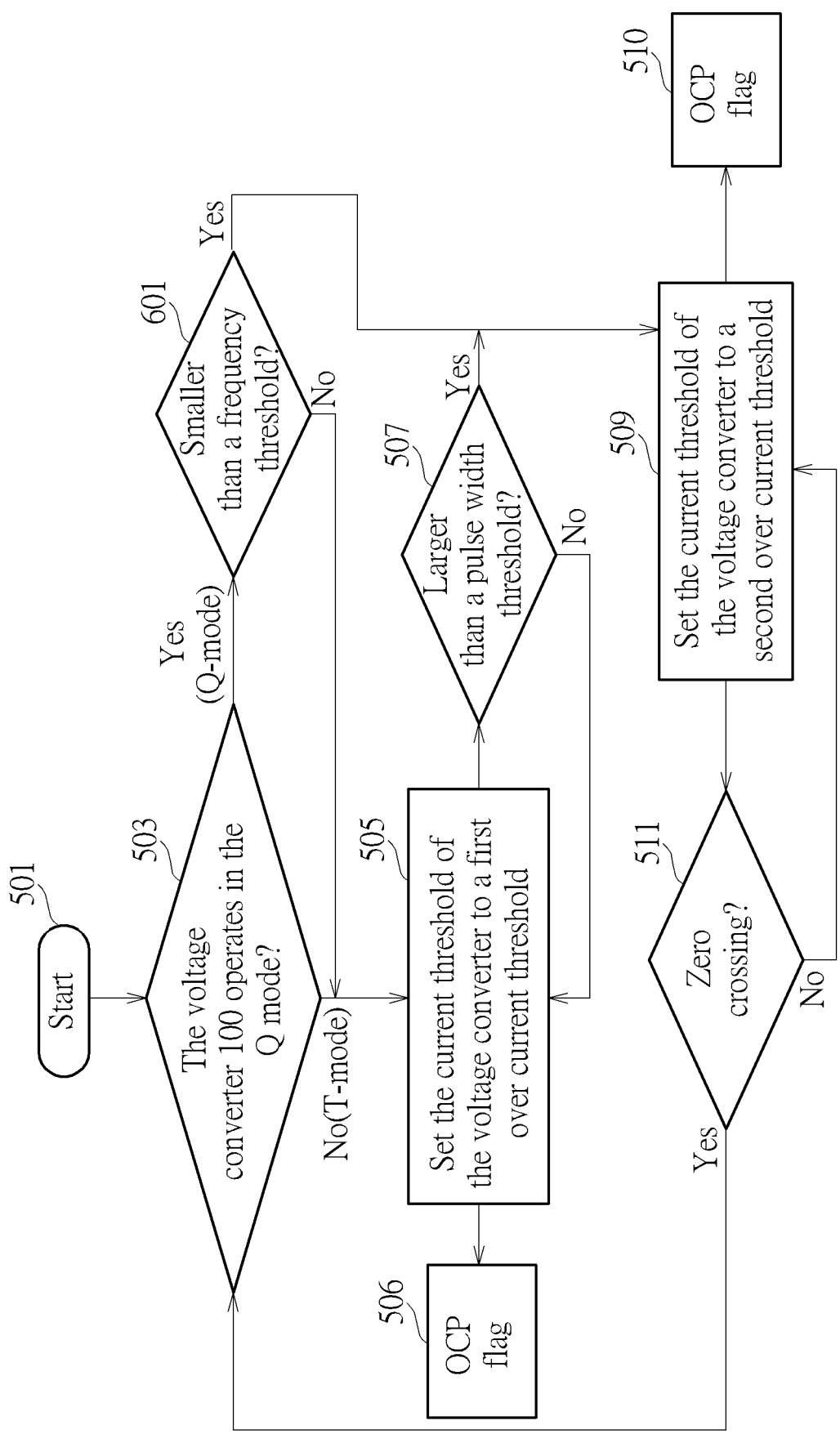

FIG. 5 and FIG. 6 are flow charts illustrating operations of the voltage converter illustrated in FIG. 1 and FIG. 3, according to different embodiments of the present invention. Please note, FIG. 5 and FIG. 6 are only examples but do not mean to limit the operations of the voltage converter provided by the present invention.

FIG. 5 comprises following steps:

Step 501

Start.

Step 503

Determine if the voltage converter 100 operates in the Q mode.

If yes, go to step 509, if not, go to step 505.

As above-mentioned, many methods can be applied to determine which mode does the voltage converter 100 operates in. One of the methods is detecting pulse widths. In another embodiment, indication data can be generated by the Q/T logic circuits QTL_1 or QTL_2. For example, the Q/T logic circuits QTL_1 can generate indication data A while operating in the Q mode and generate indication data B while operating in the T mode. Therefore, it can be determined that which mode does the voltage converter 100 operates in based on the indication data.

Step 505

Set the current threshold of the voltage converter to a first over current threshold.

In one embodiment, an ignoring time interval (e.g., deglitch time) of the voltage converter 100 to a first time interval if the voltage converter operates in the T mode, and setting the ignoring time interval to a second time interval if the voltage converter operates in the Q mode. The first time interval is smaller than the second time interval. Therefore, the step 505 can further comprise setting the ignoring time interval to the voltage converter 100 to a first time interval. Details of the ignoring time interval will be described later.

Step 506

The OCP flag corresponding to the T mode is generated.

Step 507

In one embodiment, a pulse width of the mode PWM signal is further determined that if it is larger than a pulse width threshold (e.g. 500 ns) in the T mode. The current threshold is set to (maintained at) the first over current threshold if the pulse width is not larger than the pulse width threshold (i.e., go back to step 505), since it means the pulse width is small. On the contrary, the current threshold is set to the second over current threshold (i.e., go to step 509) if the pulse width is larger than the pulse width threshold, since it means the pulse width is large.

Step 509

Set the current threshold of the voltage converter to a second over current threshold larger than the first over current threshold. In one embodiment, the first over current threshold is half of the second over current threshold. As above-mentioned, the ignoring time interval can be set to a second time interval if the voltage converter operates in the Q mode. Therefore, the step 509 may comprise: set the ignoring time interval to the second time interval.

Step 510

The OCP flag corresponding to the Q mode is generated.

Step 511

Determine whether the input signal is zero crossing. If no, go back to the step 509 to maintain at the second over current threshold and the second time interval. If yes, go to step 503. Such step means the mode of the voltage converter 100 is determined again when input signals are zero crossing.

In the embodiment of FIG. 6, the flow chart further comprises a step 601 after the step 503 and before the steps 505, 509. In the step 601, it is determined whether a frequency of the PWM signal is smaller than a frequency threshold (e.g., 1 MHz). If not, it goes to the step 505 to set the current threshold to the first over current threshold even if the voltage converter operates in the Q mode, since it means the pulse width is small. If yes, it goes to the step 509 to set the current threshold to the second over current threshold, since it means the pulse width is large.

Figure 7:
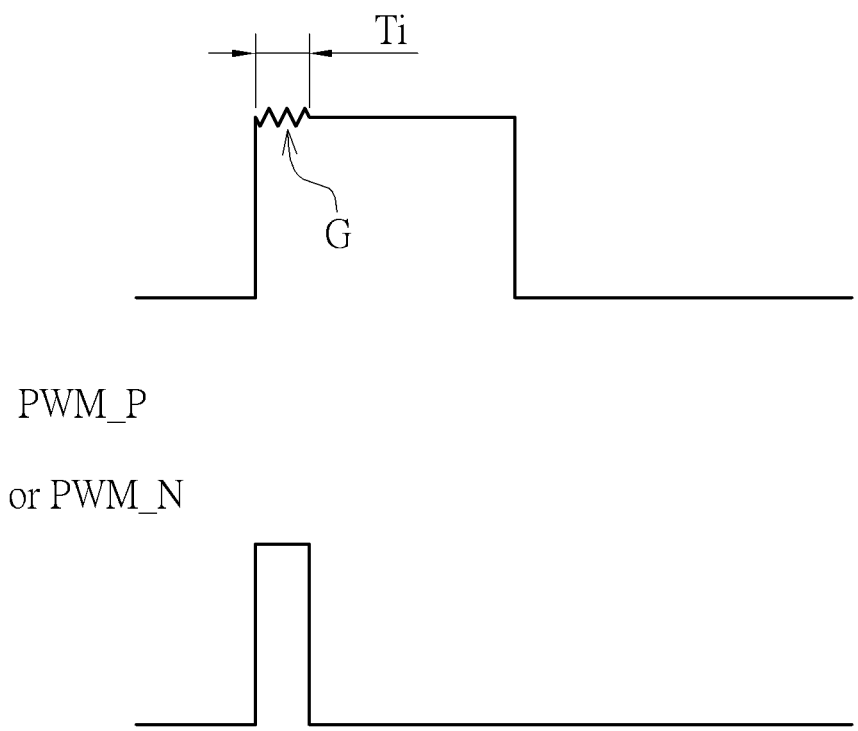
FIG. 7 is a schematic diagram illustrating the ignoring time interval illustrated in FIG. 5 and FIG. 6.

FIG. 7 is a schematic diagram illustrating the ignoring time interval illustrated in FIG. 5 and FIG. 6. The mode PWM signals PWM_P or PWM_N may have glitches G while transferring between different logic levels. Therefore, the OCP mechanism does not compare the current of the voltage converter 100 in the ignoring time interval Ti to avoid improperly triggering the OCP. However, the ignoring time interval may occupy a large ratio of a pulse of the mode PWM signal which has a smaller pulse width. Therefore, the ignoring time interval of the mode PWM signal with a smaller pulse width (e.g., the T mode) is set to be smaller than the PWM signal with a larger pulse width (e.g., the Q mode).

Therefore, as above-mentioned the ignoring time interval of the voltage converter 100 is to a first time interval if the voltage converter operates in the T mode, and the ignoring time interval is set to a second time interval if the voltage converter operates in the Q mode. The first time interval is smaller than the second time interval. In one embodiment, the first time interval is 0.

Figure 8:
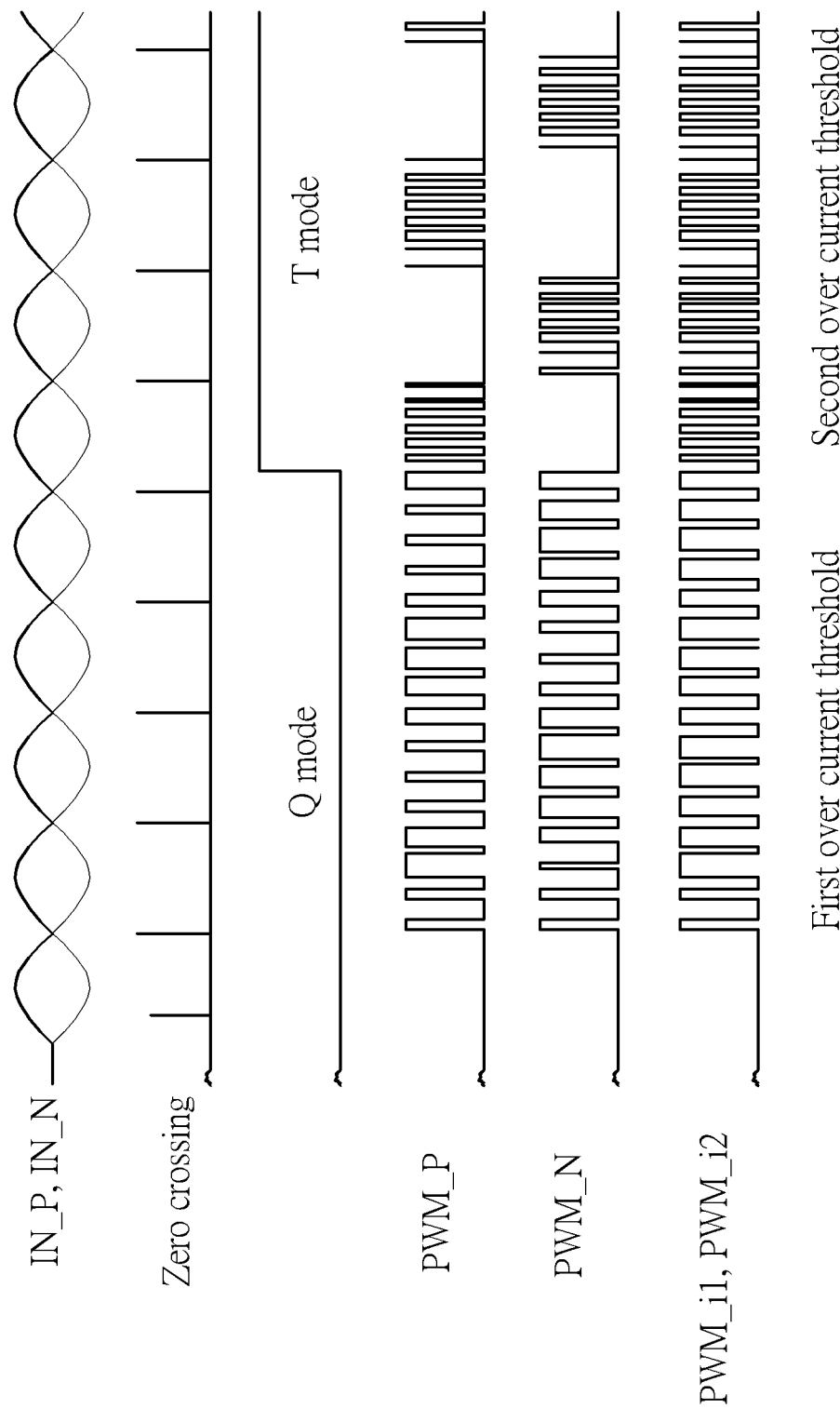
FIG. 8 is a wave chart of the voltage converter illustrated in FIG. 1 and FIG. 3, according to one embodiment of the present invention.

For the convenience of understanding, a wave chart is taken as an example for explaining the operations of the voltage converter 100. FIG. 8 is a wave chart of the voltage converter illustrated in FIG. 1 and FIG. 3, according to one embodiment of the present invention. As shown in FIG. 8, the pulse widths of the mode PWM signals PWM_N, PWM_P are detected when the input signals IN_P, IN_N are zero crossing. In the Q mode, pulse widths of the mode PWM signals PWM_N, PWM_P are larger and the current threshold of the OCP mechanism is the larger first over current threshold. On the opposite, in the T mode, pulse widths of the mode PWM signals PWM_N, PWM_P are smaller and the current threshold of the OCP mechanism is the smaller second over current threshold. In one embodiment, only one of the mode PWM signals PWM_N, PWM_P is generated in the T mode.

In view of above-mentioned embodiments, the mode of the voltage converter can be automatically detected, and settings of the OCP mechanism can be automatically changed corresponding to the mode which the voltage converter operates in. Therefore, the issue that the voltage converter could not automatically change settings of the OCP mechanism can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An over charge protection method, applied to a voltage converter which can operate in a quaternary modulation mode (Q mode) or a ternary modulation mode (T mode), comprising:
    (a) determining whether the voltage converter operates in the Q mode or the T mode; and
    (b) setting a current threshold of the voltage converter to a first over current threshold if the voltage converter operates in the T mode; and
    (c) setting the current threshold to a second over current threshold if the voltage converter operates in the Q mode, wherein the first current threshold is smaller than the second over current threshold.

2. The over charge protection method of claim 1, further comprising:
    setting an ignoring time interval of the voltage converter to a first time interval if the voltage converter operates in the T mode, and setting the ignoring time interval to a second time interval if the voltage converter operates in the Q mode, wherein the first time interval is smaller than the second time interval.

3. The over charge protection method of claim 2, wherein the first time interval is 0.

4. The over charge protection method of claim 1,
    wherein the voltage converter further comprises an output circuit configured to generate an output signal according to a mode PWM signal;
    wherein the step (a) detects a pulse width of the mode PWM signal to determine whether the voltage converter operates in the Q mode or the T mode.

5. The over charge protection method of claim 4, further comprising:
    determining whether the pulse width is larger than a pulse width threshold, after setting the current threshold to the first over current threshold when the voltage converter operates in the T mode;

setting the current threshold to the first over current threshold if the pulse width is not larger than the pulse width threshold and setting the current threshold to the second over current threshold if the pulse width is larger than the pulse width threshold.

6. The over charge protection method of claim 4, further comprising:

determining whether a frequency of the PWM signal is larger than a frequency threshold, before setting the current threshold to the first over current threshold when the voltage converter operates in the Q mode;

setting the current threshold to the first over current threshold if the frequency is not smaller than the frequency threshold, and setting the current threshold to the second over current threshold if the frequency is smaller than the frequency threshold.

7. The over charge protection method of claim 4, wherein the step (a) detects the pulse width at a zero crossing point of input signals of the voltage converter.

8. The over charge protection method of claim 1, wherein the first over current threshold is half of the second over current threshold.

9. The over charge protection method of claim 1, wherein the voltage converter is a D type amplifier.

10. A voltage converter, which can operate in a quaternary modulation mode (Q mode) or a ternary modulation mode (T mode), comprising:

an error amplifier, configured to receive input signals;

a PWM circuit, configured to generate initial PWM signals according to outputs of the error amplifier;

at least one Q/T logic circuit, configured to use quaternary modulation or ternary modulation mode modulation to generate at least one mode PWM signal;

an output circuit configured to generate an output signal according to a mode PWM signal;

a mode detection circuit, configured to detect whether the voltage converter operates in the Q mode or the T mode;

an over charge protection (OCP) circuit, configured to limit a current of the voltage converter to be lower than a current threshold;

wherein the current threshold is set to a first over current threshold if the voltage converter operates in the T mode; and wherein the current threshold is set to a second over current threshold larger than the first over current threshold if the voltage converter operates in the Q mode.

11. The voltage converter of claim 10, wherein an ignoring time interval of the OCP circuit is set to a first time interval if the voltage converter operates in the T mode, is set to a second time interval if the voltage converter operates in the Q mode, wherein the first time interval is smaller than the second time interval.

12. The voltage converter of claim 11, wherein the first time interval is 0.

13. The voltage converter of claim 10, wherein the mode detection circuit detects a pulse width of the mode PWM signal to determine whether the voltage converter operates in the Q mode or the T mode.

14. The voltage converter of claim 13, further comprising:

wherein the mode detection circuit further determines whether the pulse width is larger than a pulse width threshold, after the current threshold is set to the first over current threshold when the voltage converter operates in the T mode;

wherein the current threshold is set to the first over current threshold if the pulse width is not larger than the pulse width threshold and is set to the second over current threshold if the pulse width is larger than the pulse width threshold.

15. The voltage converter of claim 13, further comprising:

wherein the mode detection circuit further determines whether a frequency of the PWM signal is larger than a frequency threshold, before setting the current threshold to the first over current threshold when the voltage converter operates in the Q mode;

wherein the current threshold is set to the first over current threshold if the frequency is not smaller than the frequency threshold, and is set to the current threshold to the second over current threshold if the frequency is smaller than the frequency threshold.

16. The voltage converter of claim 13, wherein the mode detection circuit detects the pulse width at a zero crossing point of input signals of the voltage converter.

17. The voltage converter of claim 10, wherein the first over current threshold is half of the second over current threshold.

18. The voltage converter of claim 10, wherein the voltage converter is a D type amplifier.

* * * * *